(12) United States Patent
Iorga

(10) Patent No.: US 10,560,075 B1
(45) Date of Patent: Feb. 11, 2020

(54) FPGA CONFIGURED VECTOR NETWORK ANALYZER FOR MEASURING THE Z PARAMETER AND S PARAMETER MODELS OF THE POWER DISTRIBUTION NETWORK IN FPGA SYSTEMS

(71) Applicant: Cosmin Iorga, Westlake Village, CA (US)

(72) Inventor: Cosmin Iorga, Westlake Village, CA (US)

( * ) Notice: Subject to any disclaimer, the term of this patent is extended or adjusted under 35 U.S.C. 154(b) by 0 days.

(21) Appl. No.: 16/009,203

(22) Filed: Jun. 15, 2018

Related U.S. Application Data

(60) Provisional application No. 62/604,053, filed on Jun. 22, 2017.

(51) Int. Cl.
| | |
|---|---|
| *G01R 31/3181* | (2006.01) |
| *G01R 31/42* | (2006.01) |
| *H03K 3/011* | (2006.01) |
| *H03K 3/03* | (2006.01) |
| *H03L 7/099* | (2006.01) |
| *H02J 3/24* | (2006.01) |
| *G01R 31/317* | (2006.01) |
| *G01R 31/3185* | (2006.01) |
| *H02J 3/00* | (2006.01) |
| *G06Q 50/06* | (2012.01) |

(52) U.S. Cl.
CPC ..... *H03K 3/0315* (2013.01); *G01R 31/31721* (2013.01); *G01R 31/318519* (2013.01); *G01R 31/42* (2013.01); *H02J 3/24* (2013.01); *H03K 3/011* (2013.01); *H03L 7/0995* (2013.01); *G06Q 50/06* (2013.01); *H02J 2003/002* (2013.01); *H02J 2003/007* (2013.01)

(58) Field of Classification Search
CPC ...... G01R 31/31721; G01R 31/318516; G01R 31/318519; G01R 31/40; G01R 31/42; H02J 3/24; H02J 2003/002; H02J 2003/007; H03K 3/011; H03K 3/0315; H03K 3/0322; H03L 7/0995
USPC ............................................. 331/57; 702/65
See application file for complete search history.

(56) References Cited

U.S. PATENT DOCUMENTS

| | | | | |
|---|---|---|---|---|
| 8,060,661 | B1 * | 11/2011 | Wright ...... | G06F 1/22 710/104 |
| 9,310,432 | B2 * | 4/2016 | Iorga ............... | G01R 31/31721 |
| 2009/0228847 | A1 * | 9/2009 | Suaya ................ | G06F 17/5036 716/136 |
| 2015/0137895 | A1 * | 5/2015 | Raj ........................ | H03B 27/00 331/25 |

* cited by examiner

*Primary Examiner* — Levi Gannon

(57) ABSTRACT

Measurement of power distribution network (PDN) Z-parameters and S-parameters of a programmable logic device (PLD), such as field programmable gate array (FPGA) or complex programmable logic device (CPLD), is performed by configuring and using only logic blocks and I/O blocks commonly available in any existing programmable logic device, without the need of built-in dedicated circuits. The measured models include the PDN elements on the PLD die, PLD package, and PCB. The S-parameter and Z-parameter models can be then used in circuit simulation tools to evaluate the power supply noise in the PLD logic core and the timing jitter in the PLD I/O data links.

10 Claims, 6 Drawing Sheets

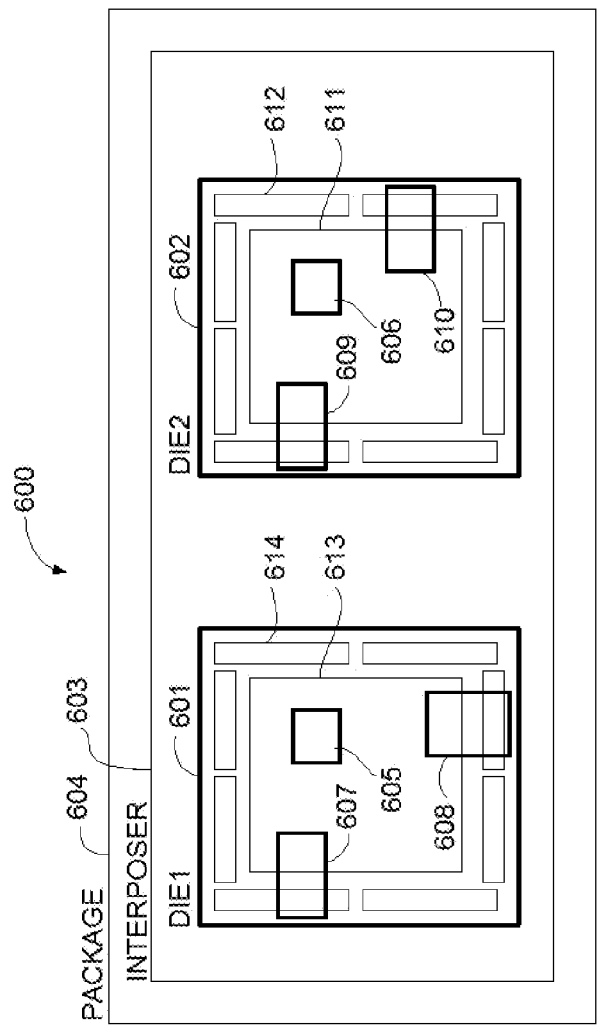
FIG. 6A
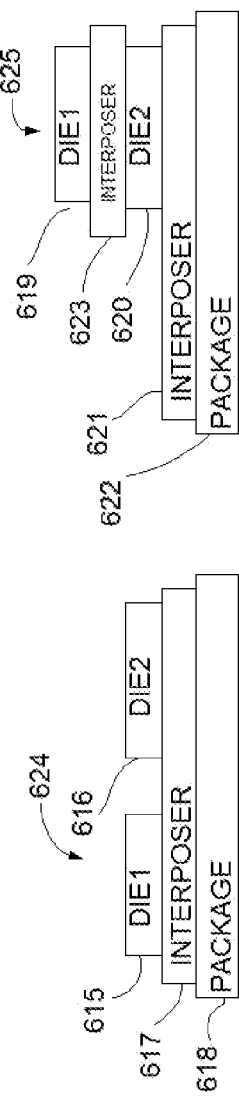
FIG. 6C
FIG. 6B

US 10,560,075 B1

FPGA CONFIGURED VECTOR NETWORK ANALYZER FOR MEASURING THE Z PARAMETER AND S PARAMETER MODELS OF THE POWER DISTRIBUTION NETWORK IN FPGA SYSTEMS

CROSS-REFERENCE TO RELATED APPLICATIONS

This application claims the benefit of U.S. Provisional Patent application Ser. No. 62/604,053 entitled "EMBEDDED VECTOR NETWORK ANALYZER (VNA) FOR MEASURING THE IMPEDANCE AND S-PARAMETER MODEL OF THE POWER DISTRIBUTION NETWORK IN PROGRAMMABLE LOGIC DEVICE (PLD) SYSTEMS" which was filed Jun. 22, 2017. The entirety of the aforementioned application is herein incorporated by reference.

FIELD OF THE INVENTION

This invention relates to programmable logic devices integrated circuits, and more particularly to measuring the power distribution impedance magnitude and phase, and measuring the power distribution s-parameter and z-parameter models of a programmable logic device connected to a power distribution network circuit.

BACKGROUND OF THE INVENTION

Programmable logic devices (PLD) such as field programmable gate arrays (FPGA) and complex programmable logic devices (CPLD), are integrated circuits that can be programmed by users to perform customized logic functions. In a typical design process a user defines customized logic functions using a computer aided design software tool, such as schematic capture or hardware description language (HDL). The software tool then implements the design for a specified programmable logic device type using configurable logic block resources available on that device. The implemented design is stored in a configuration data file. This data file is then loaded into a programmable logic device, configuring the programmable logic device to perform the user's defined customized logic functions.

A programmable logic device is typically mounted on a printed circuit board (PCB) as part of an electronic system. At least one voltage regulator device mounted on the printed circuit board, or external to the printed circuit board, provides power supply to the programmable logic device. The electric circuit comprising the voltage regulator, the interconnects from the voltage regulator to the on-die circuits of the programmable logic device, and any decoupling capacitors is called power distribution network (PDN).

Typical programmable logic device dies are fabricated in complementary metal-oxide-semiconductor (CMOS) process. In digital circuits fabricated in CMOS process when a signal transitions from a logic state "false" to a logic state "true" a transient electric current flows from the positive node of the power supply into the digital circuit. Similarly when a signal transitions from a logic state "true" to a logic state "false" a transient electric current flows from the digital circuit into the negative node of the power supply. These transient currents flow through the power distribution network and generate transient voltage drops on the electrical impedance of the power distribution components through which these transient currents flow. As a direct consequence of the transient voltage drops, the on-die positive voltage supply drops momentarily and the on-die negative voltage supply rises momentarily. The on-die circuits see these momentary supply voltage drops and rises as power supply noise. This noise is called switching noise because the switching of signal logic states in the digital circuit generates it.

In a typical programmable logic device multiple signals may switch at the same moment in time increasing the magnitude of switching noise on the positive and negative supplies. This effect is commonly referred to as simultaneous switching noise (SSN). Simultaneous switching noise (SSN) degrade the performance of the programmable logic device circuits. The magnitude of the simultaneous switching noise (SSN) depends on the number of switching gates of the programmable logic device, the switching speed, and the electrical impedance of the power distribution network (PDN).

In general, the power distribution network impedance is a complex quantity having the magnitude and phase dependent on frequency. As a direct consequence, the magnitude and phase of simultaneous switching noise depends on the frequency of operation of the programmable logic device. Most power distribution networks present impedance magnitude peaks at some frequencies, called resonance peaks. If operating frequency of the programmable logic device, or harmonics of the operating frequency, overlap with a resonance peak of the power distribution network, then significant noise is generated on the on-die voltage supplies.

Knowing the frequency characteristics of the power distribution impedance can help reduce the simultaneously switching noise by configuring the programmable logic device to operate at frequencies that do not overlap with the resonance peak frequencies. Alternately, designers can modify the power distribution network circuit so that the resonance peaks do not overlap with operating frequencies or their harmonics, which is typically done through adjusting the values of decoupling capacitors.

Programmable Logic Devices have multiple voltage value power supply domains connected to different functional blocks, like for example the core logic may be connected to one power supply domain while input/output blocks may be connected to a different power supply domain. More, the input/output blocks may be organized in banks, each bank being connected to a different power supply domain. For example an FPGA with eight I/O banks may have nine power supply domains, one for the core logic and a separate one for each I/O bank. Each power supply domain has a separate power delivery network path for electric current; however, due to various coupling mechanisms like for example electromagnetic coupling and coupling through shared ground impedance, there is interaction between different power supply domains. Power supply noise generated in one power supply domain may couple into a second power supply domain degrading the performance of the circuits powered from the second power supply domain. The supply noise and supply noise coupling can be evaluated through modeling and simulation. The most common type of power distribution model is the s-parameter model. Alternately z-parameter, y-parameter, h-parameter, and other similar type of models are used. These models can be created from the physical layout design files of die, package, and PCB. While this approach works well for custom integrated circuit designs where design engineers have access to all the design files of the die, package, and PCB, in programmable logic device (PLD) applications design engineers typically have access only to the PCB layout design files but not to the PLD die and package layout design files. PLD manufacturers do not provide the physical implementation layout files of their products to customers. The present invention overcomes this issue by providing a method to extract the s-parameter model of the power distribution network of a PLD system including the die, package, and PCB structures.

The present invention provides an embedded Vector Network Analyzer (VNA) instrument for power distribution measurements in programmable logic devices that is able to measure on-die the electrical impedance of each power supply domain of a the power distribution network of a programmable logic device (PLD) and the coupling between different power supply domains by using only general configurable logic blocks available in any programmable logic device (PLD), without the need of built-in dedicated circuits.

BRIEF SUMMARY OF THE INVENTION

This invention provides a system and method for measuring the magnitude and phase frequency characteristics of electrical impedance of a power supply domain of a power distribution network and the magnitude and phase frequency characteristics of the coupling between different power supply domains of the power distribution network of a programmable logic device (PLD) by configuring and using only general configurable logic blocks and/or input-output blocks resources commonly available in any existing programmable logic device. The magnitude and phase measurements are used to generate one-port or multi-port s-parameter model, or z-parameter or any other type of network model (y-parameter, h-parameter, etc.). All measurements are done inside the programmable logic device without the need of external instruments. The magnitude and phase frequency characteristics measurement capabilities of the system of this invention represent an expansion to the measurement capabilities of a typical Vector Network Analyzer (VNA) test instrument. A typical VNA instruments has two measurement ports so that it can measure the magnitude and phase characteristics of the device under test impedance at each port and the magnitude and phase frequency characteristics of the coupling between the two ports. The system and method of this invention expands the typical VNA capability to an unlimited number of measurement ports. The measurement system of this invention represents a Vector Network Analyzer (VNA) configured in the programmable logic device (PLD).

The main advantage of using resources that are not specifically built-in for power distribution measurements is that this invention can be used with most of the existing programmable logic devices (PLD) available on the market, including field programmable gate arrays (FPGA) and complex programmable logic devices (CPLD).

Another advantage of using resources that are not specifically built-in for power distribution measurements is that this invention can be implemented in a programmable logic device temporarily only for characterization or troubleshooting purposes, after which the programmable logic device can be reconfigured to perform any other user defined logic functions. This way, after characterization or troubleshooting, the programmable logic device resources used for power distribution impedance measurements are freed up and re-configured to perform other logic functions, saving cost and reducing power consumption.

A third advantage of using only internal resources of the programmable logic device is that this invention can be used to remotely troubleshoot existing electronic systems that use programmable logic devices and operate in hardly accessible locations, like for example data communication equipment installed in the field. For example a common failure mechanism in electronic systems is internal shorting of tantalum electrolytic capacitors, which burns internal fuses built-in inside tantalum electrolytic capacitors. As a direct consequence, a burned capacitor becomes an open circuit and does not perform the intended power distribution decoupling function. Typical power distribution networks comprise multiple tantalum decoupling capacitors connected in parallel, and if some of them burn their internal fuses, the impedance of the power distribution increase. One way to detect an increase of power distribution impedance is to measure it; however, most existing techniques require major disruption of the electronic system to get access to measurement nodes and connect measurement instruments. The present invention allows more convenient troubleshooting by remotely accessing the programmable logic device and measuring the power distribution impedance using only internal configurable logic blocks resources commonly available in any programmable logic device. After troubleshooting, the programmable logic device can be reconfigured remotely back to the original functionality.

Other features and advantages of the present invention will become apparent to one skilled in the art from examination of the accompanying drawings and detail description.

BRIEF DESCRIPTION OF DRAWINGS

FIG. 6A illustrates a structural diagram of an embodiment of the current invention implemented on multiple dies of a multi-die or 3D-IC programmable logic device.

FIG. 6B illustrates a cross-section of the structural diagram of FIG. 6A implemented in a multi-die programmable logic device.

FIG. 6C illustrates a cross-section of the structural diagram of FIG. 6A implemented in a 3D-IC multi-die programmable logic device.

DETAILED DESCRIPTION OF THE INVENTION

The description presented herein will focus on a system and method implemented in a programmable logic device (PLD) and more specifically in a field programmable gate array (FPGA); however, it is significant to note that the enclosed embodiments are not to be considered as limiting. Those skilled in the art will appreciate that the concepts and embodiments of the present invention may be applied to various types of programmable devices and integrated circuits.

Figure 1:
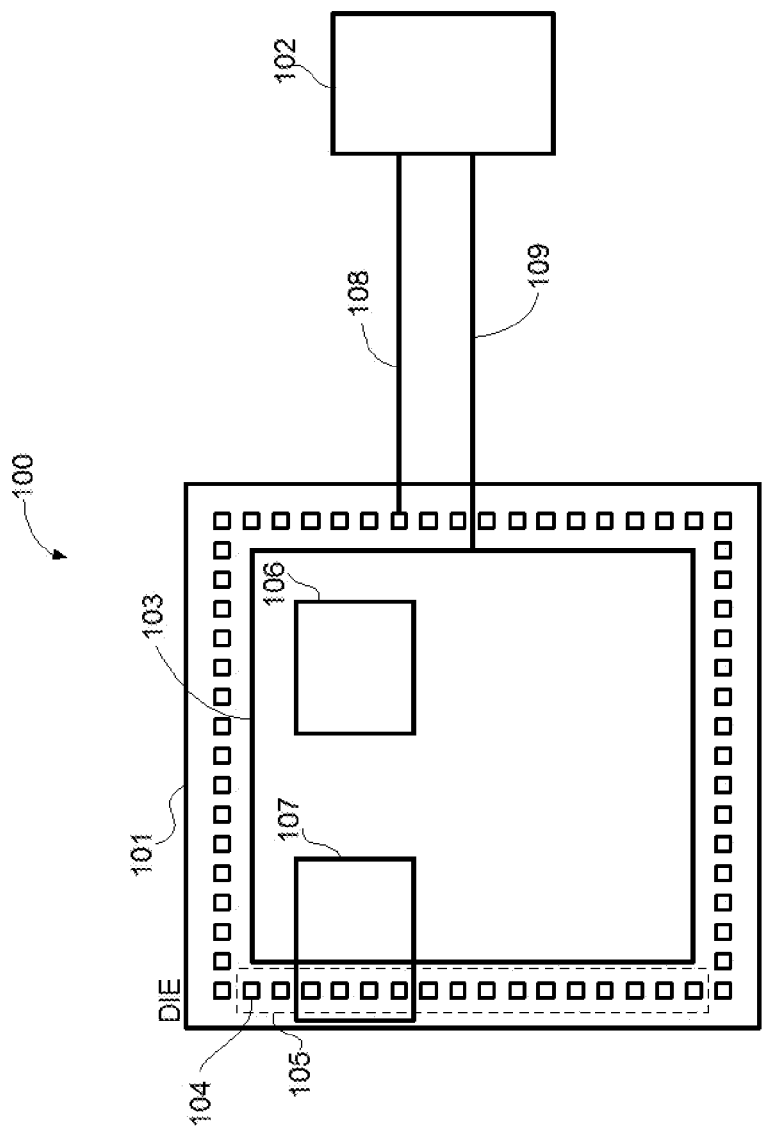
FIG. 1 is a structural diagram of a prior art illustrating a programmable logic device integrated circuit connected to a power distribution network and configured to measure the magnitude of the electrical impedance of the power distribution network.

Turning now to the drawing representing the prior art, FIG. 1 illustrates a structural diagram, generally designated 100, of a programmable logic device die 101 connected to a power distribution network 102 through electrical interconnects 108 for each I/O bank and 109 for the core logic. The programmable logic device die contains a core logic fabric 103 and multiple input/output blocks (I/O) 104 that form an (I/O) bank 105. There can be multiple I/O banks in a programmable logic device, each I/O bank having separate power supply input pins, so that the I/O cells may operate at different supply voltages and different signal transmission standards. Part of the core logic fabric is configured as a first system 106 that measures the magnitude frequency characteristic of electrical impedance of the core logic power distribution network, and part of the I/O blocks and part of core logic fabric is configured as a second system 107 that measures the magnitude frequency characteristic of electrical impedance of the I/O bank power distribution network. The second system may contain fabric elements of the I/O bank only or of the I/O bank and logic core.

Figure 2:
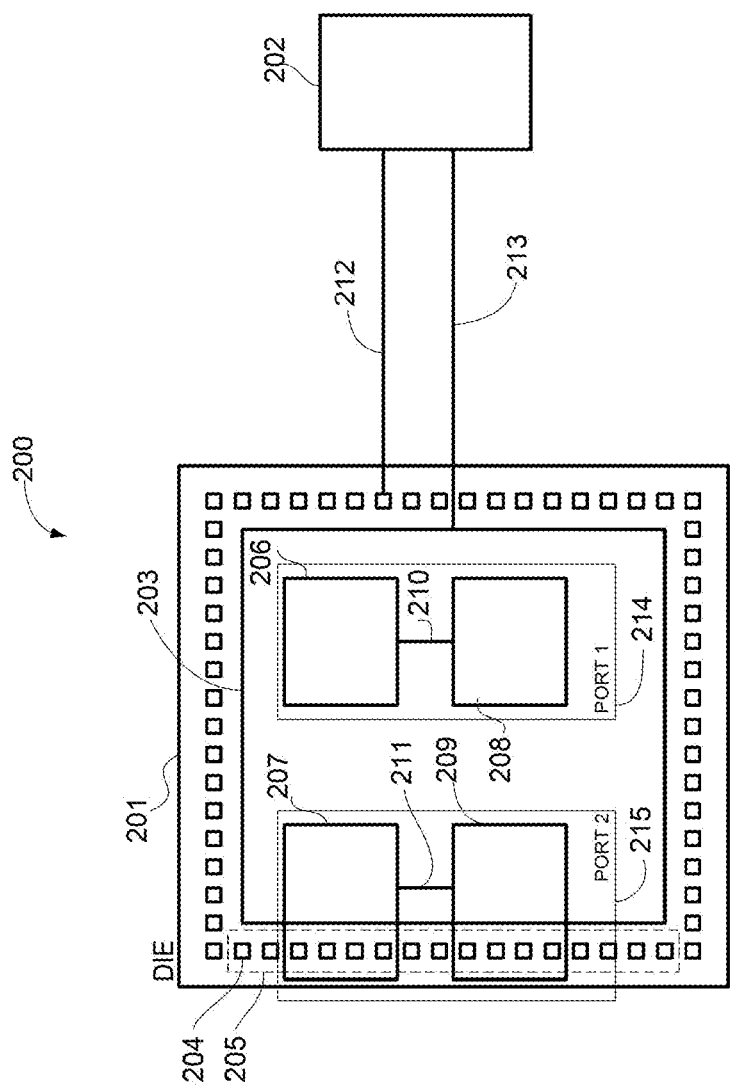
FIG. 2 is a structural diagram of the current invention illustrating a programmable logic device integrated circuit connected to a power distribution network and configured to measure the magnitude and phase of the electrical impedance of the power distribution network and the s-parameter, z-parameter, and other type of models of the power distribution network.

Turning now to the drawing representing an embodiment of the current invention, FIG. 2 illustrates a structural diagram, generally designated 200, of a programmable logic device die 201 connected to a power distribution network 202 through electrical interconnects 212 for each I/O bank and 213 for the core logic. The programmable logic device die contains a core logic fabric 203 and multiple input/output blocks (I/O) 204 grouped in one or more (I/O) banks 205. Part of the core logic fabric is configured as a first system 206 that measures the magnitude frequency characteristic of electrical impedance of the core logic power distribution network, and part of the I/O blocks and part of core logic fabric is configured as a second system 207 that measures the magnitude frequency characteristic of electrical impedance of the I/O bank power distribution network. The second system may contain fabric elements of the I/O bank only or of the I/O bank and logic core.

In addition to magnitude frequency characteristic measurements, part of the core logic fabric is configured as a third system 208 that measures the phase frequency characteristic of electrical impedance of the core logic power distribution network, and part of the I/O blocks and part of core logic fabric is configured as a fourth system 209 that measures the phase frequency characteristic of electrical impedance of the I/O bank power distribution network. The fourth system may contain fabric elements of the I/O bank only or of the I/O bank and logic core.

The third system 208 is electrically coupled to the first system 206 through at least one interconnect 210 and the fourth system 209 is electrically coupled to the second system 207 through at least one interconnect 211.

The first system 206 generates a sinusoidal or square wave electric current through the core logic power supply domain of the power distribution network. This electric current, I1(t), generates a sinusoidal or square wave voltage variation, V1(t), on the core logic power supply domain following V1(t)=I1(t)*Z1, where Z1 is the impedance of the core logic power supply domain of the power distribution network. The first system 206 measures the magnitude of V1(t) and the third system 208 measures the phase of V1(t). The magnitude can be notated Mag_V1, and the phase can be notated Ph_V1.

This measurement repeated at multiple frequencies produces a frequency characteristic of magnitude and phase of V1. The magnitude can be notated Mag_V1(f) where f means that Mag_V1 is a function of frequency, and the phase can be notated Ph_V1(f) where f means that Ph_V1 is a function of frequency. Mag_V1(f) and Ph_V1(f) represent a complex number, which can also be represented as real part of V1, Re_V1, and imaginary part of V1, Im_V1. One way to further process these measurements is to divide V1/I1 and calculate the electrical impedance of the core logic power supply domain of the power distribution network. The impedance is a complex number and it is represented in the form of magnitude and phase or in the form of real part and imaginary part. The impedance values measured at multiple frequencies can be used to create an s-parameter, z-parameter, y-parameter, or any other n-port type derivative model that can be further used in circuit simulation tools. For one-port network the model is a text file that includes a three column table in which each row has three values: frequency, magnitude, and phase. Each frequency value used for measurement generates one magnitude and one phase value for the measured impedance, which are represented by one row in the one-port model file table. This model is also called Z-parameter model. The Z-parameter model can be converted into Scattering Parameter Model, notated also s-parameter model, or admittance parameter model, notated also Y-parameter model, Hybrid-h parameter model, notated also h-parameter model, or Hybrid-g parameter model, notated also g-parameter model. There are other types of models that can be generated from the ones listed above. Each of these parameter model types can be used in circuit simulation tools. For multi-port networks the models have multiple columns, each corresponding for one combination of signal applied to one port and measured at another port. The number of columns is equal to all the possible combinations of driving port and receiving port. Typical Vector Network Analyzers (VNA) test instruments measure s-parameter and z-parameter models of two ports networks. By measuring z-parameters and s-parameters models of the power distribution network, this invention reassembles the functionality of a Vector Network Analyzer test instrument configured inside of a programmable logic device (PLD) or Field Programmable Gate Arrays (FPGA).

Referring also to FIG. 2, the second system 207 generates a sinusoidal or square wave electric current through the I/O bank power supply domain of the power distribution network. This electric current, I2(t), generates a sinusoidal or square wave voltage variation, V2(t), on the I/O bank power supply domain following V2(t)=I2(t)*Z2, where Z2 is the impedance of the I/O bank power supply domain of the power distribution network. The second system 207 measures the magnitude of V2(t) and the fourth system 209 measures the phase of V2(t).

This measurement repeated at multiple frequencies produces a frequency characteristic of magnitude and phase of V2(t). The magnitude can be notated Mag_V2(f) where f means that Mag_V2 is a function of frequency, and the phase can be notated Ph_V2(f) where f means that Ph_V2 is a function of frequency. Mag_V2(f) and Ph_V2(f) represent a complex number, which can also be represented as real part of V2, Re_V2, and imaginary part of V2, Im_V2. One way to further process these measurements is to divide V2/I2 and calculate the electrical impedance of the I/O power supply domain of the power distribution network. The impedance is a complex number and it is represented in the form of magnitude and phase or in the form of real part and imaginary part. The impedance values measured at multiple frequencies can be used to create an s-parameter, z-parameter, y-parameter, or any other n-port type derivative model that can be further used in circuit simulation tools. For one-port network the model is a text file that includes a three column table in which each row has three values: frequency, magnitude, and phase. Each frequency value used for measurement generates one magnitude and one phase value for the measured impedance, which are represented by one row in the model file table. This model is also called Z-parameter model. The Z-parameter model can be converted into Scattering Parameter Model, notated also s-parameter model, or admittance parameter model, notated also Y-parameter model, Hybrid-h parameter model, notated also h-parameter model, or Hybrid-g parameter model, notated also g-parameter model, or any other type of n-port model. Each of these parameter model types can be used in circuit simulation tools. For multi-port networks the models have multiple columns, each corresponding for one combination of signal applied to one port and measured at another port. The number of columns is equal to all the possible combinations of driving port and receiving port.

Referring now back to FIG. 2, this invention can also measure a two port s-parameter model or a derivative (z-parameter, y-parameter, or any other type of n-port parameter model). As a notation, port 1 of the model is the core logic power supply domain outputs of the power distribution network and the port 2 is the I/O power supply domain outputs of the power distribution network. First system 206 and third system 208 are connected to port 1, designated 214 in FIG. 2, and second system 207 and fourth system 209 are connected to port 2, designated 215 in FIG. 2. There are four measurements needed to create a z-parameter, s-parameter, etc. model.

Measurement 1 uses first system 206 to generate a sinusoidal or square wave current through the core logic power domain power distribution network, first system 206 to measure the magnitude of the core logic power supply, and third system 208 to measure the phase of the core logic power supply. This is the same measurement described for a one-port model measurement of the core logic power domain of the power distribution network. The magnitude of the measured value can be named V11_mag, and the phase V11_phase, where the subscripts of V11 represent stimulus applied to port 1 and measurement done at port 1.

Measurement 2 uses second system 207 to generate a sinusoidal or square wave current through the I/O bank power domain power distribution network, second system 207 to measure the magnitude of the I/O bank power supply voltage and fourth system 209 to measure the phase of the I/O bank power supply voltage. This is the same measurement described for a one-port model measurement of I/O power domain power distribution network. The magnitude of the measured value can be named V22_mag, and the phase V22_phase, where the subscripts of V22 represent stimulus applied to port 2 and measurement done at port 2.

Measurement 3 uses first system 206 to generate a sinusoidal or square wave current through the core logic power domain power distribution network, second system 207 to measure the magnitude of the I/O bank power supply voltage and fourth system 209 to measure the phase of the I/O bank power supply voltage. This measurement represents the transmitted signal from core logic power supply port to the I/O logic power domain port. The magnitude of the measured value can be named V12_mag, and the phase V12_phase, where the subscripts of V12 represent stimulus applied to port 1 and measurement done at port 2.

Measurement 4 uses second system 207 to generate a sinusoidal or square wave current through the I/O bank power domain power distribution network, first system 206 to measure the magnitude of the core logic power supply and third system 208 to measure the phase of the core logic power supply. This measurement represents the transmitted signal from the I/O power supply port to the core logic power domain port. The magnitude of the measured value can be named V21_mag, and the phase V21_phase, where the subscripts of V21 represent stimulus applied to port 2 and measurement done at port 1.

The measured magnitude and phase values V11_mag, V11_phase, V12_mag, V12_phase, V21_mag, V21_phase, V22_mag, and V22_phase can be used to create a z-parameter model of the 2-port network power distribution network following one of the existing standard formats in the industry (like for example the IBIS Touchstone format standard). Alternately an s-parameter or any other type of n-port models as described above can be created.

In one embodiment of this invention the measurements described above can be controlled by a software program running in an external computer electrically connected to the programmable logic device. In a second embodiment of this invention the measurements described above can be controlled by a controller system implemented in an electronic device like for example a microcontroller or a second programmable logic device electrically connected to the programmable logic device. In a third embodiment of this invention the measurements described above can be controlled by a controller system implemented in the same programmable logic device as the measurements. In a fourth embodiment of this invention the measurements described above can be controlled by a controller system implemented in any combination of the measured programmable logic device, separate programmable logic device, multiple electronic devices, and external computers electrically connected to the programmable logic device.

Figure 3:
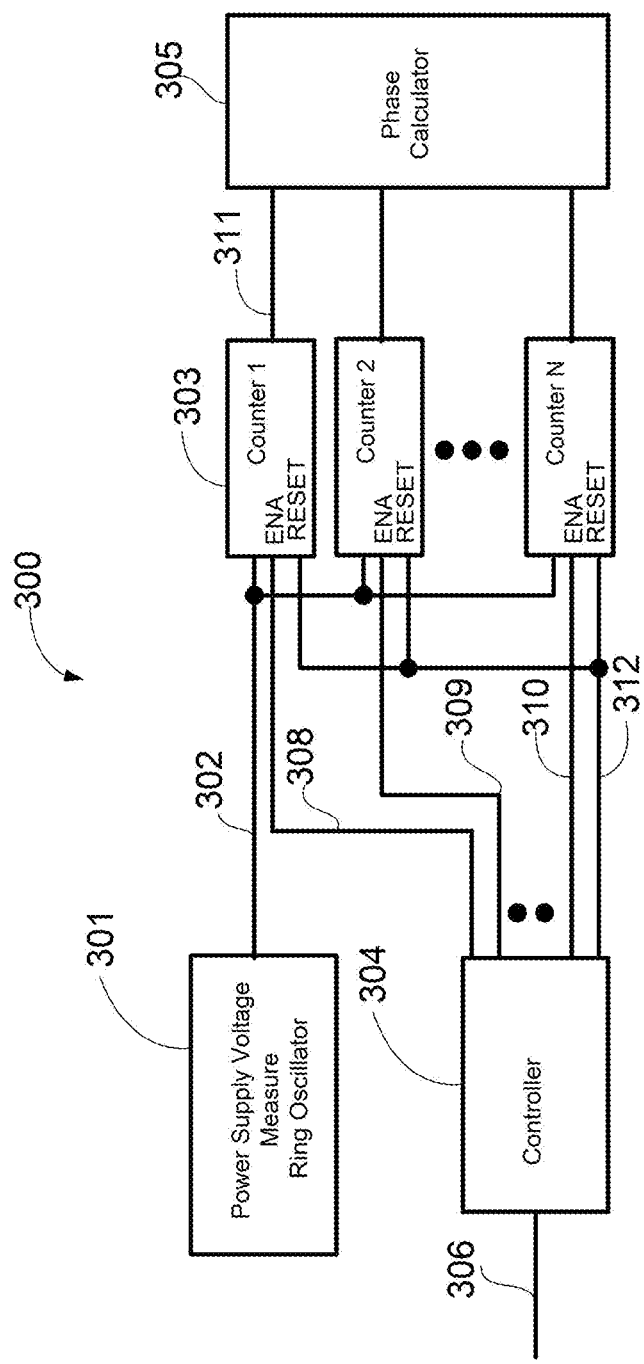
FIG. 3 is a structural diagram of the phase measurement system of the current invention illustrating a power supply voltage measure ring oscillator, a controller, multiple frequency counters, and a phase calculator block.

FIG. 3 represents the phase measurement block diagram, generally designated 300, also notated third system 208 in FIG. 2 and fourth system 209 in FIG. 2. With reference to FIG. 3, a ring oscillator 301 powered from a power domain voltage supply of the power distribution network of the programmable logic device is electrically connected 302 to multiple frequency counters 303. Each frequency counter has an enable feature activated by an enable input and a reset feature activated by a reset input. A control block 304 controls the enable and reset functions of the frequency counters. Each enable input is controlled separately by the controller block, 308 for Counter 1 block, 309 for Counter 2 block, . . . 310 for Counter N block. The reset input can be controlled together by a single signal 312. The control block 304 receives the synchronization signal 306. The synchronization signal is provided by system 206 in FIG. 2 through interconnect 210 or system 207 in FIG. 2 through interconnect 211. The outputs of the frequency counters 311 are connected to a phase calculation block 305.

Figure 4:
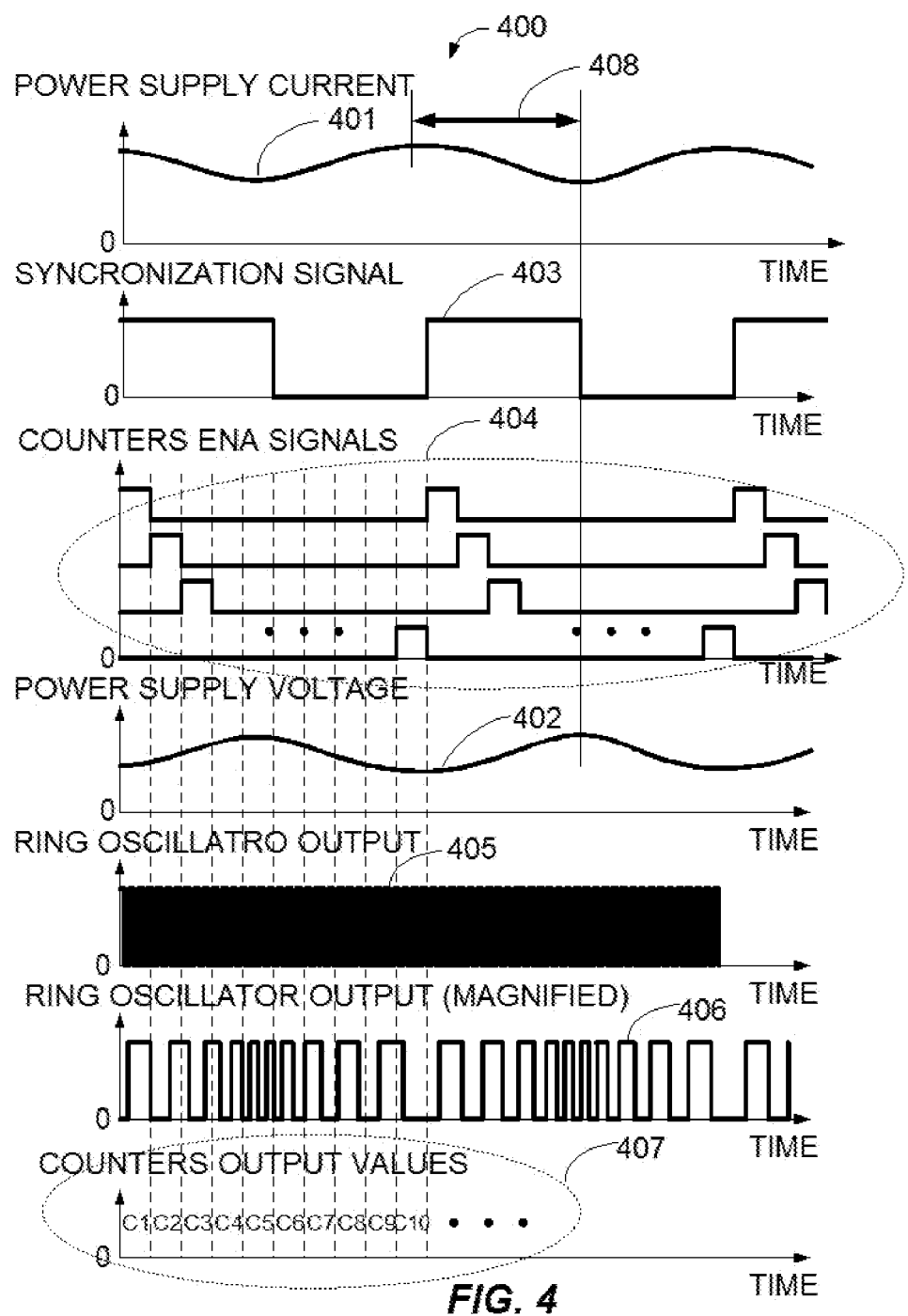
FIG. 4 is a functional diagram of the phase measurement system in accordance with the present invention.

Turning now to FIG. 4, which represents a phase measurement timing diagram generally designated 400, trace 401 represents a power supply domain sinusoidal current generated by the first system 206 of FIG. 2. Trace 402 represents the resulted voltage variation generated by the sinusoidal current 401 flowing through the power supply domain power delivery network. Trace 402 can also represent the resulted voltage variation generated by the sinusoidal current 401 flowing through a different power supply domain and coupled into the other power supply domains of the power delivery network. Because the impedance of the power supply domain of the power delivery network is a complex number quantity, the phase of the voltage variation 402 is shifted with respect of the phase of the power supply current variation 401. This phase shift 408 depends on the frequency of the sinusoidal signals. Similar phase shift happens if the current waveform 401 is a square wave signal and the voltage waveform 402 is a square wave signal. Trace 403 is a synchronization signal generated by first system 206 and transmitted to the third system 208 in FIG. 2 and transmitted through interconnect 210 in FIG. 2. This synchronization signal 403 is correlated in phase with the sinusoidal current 401 at all operation frequencies. The synchronization signal 403 is applied to the controller block 304 in FIG. 3 through interconnect 306 in FIG. 3. The controller block 304 generates multiple phase signals 404. Each of the multiple phase signals 404 is active over a subdivision of the signal 403 period, like for example period/10 in the timing diagram of FIG. 4, however, any other subdivision factor can be used. At a given moment in time only one of the multiple phase signals 404 is active. Each of the multiple phase signals controls the enable input of one of the frequency counters 303. During a period of synchronization signal 403 the frequency counters 303 are enabled and disabled in sequence one at a time covering the entire period.

The sinusoidal power supply voltage signal 402 modulates the frequency of the ring oscillator 301 output waveform generating a frequency-modulated digital signal as shown by trace 405. To better visualize this modulation, signal 406 represents an abstract magnification of the instantaneous frequency of signal 405. The frequency of signal 405 and 406 increases when the voltage of signal 402 increases and decreases when the voltage of signal 402 decreases. This happens because the delay of the elements of a ring oscillator increase at lower voltage supply values and decrease at higher voltage supply values.

Each frequency counter will measure the frequency of the ring oscillator signal 405 during the time when it is enabled. The count value outputs reflect the average ring oscillator frequency during the corresponding enable time. Because the frequency counters are enabled in sequence throughout a full period, the sequence of count values 407 throughout a full period will reflect the voltage variation of signal 402. The maximum count value in this sequence will occur on the frequency counter that was enabled during the maximum value of signal 402. Therefore from the sequence of count values of the frequency counters 407 the phase shift 408 of signal 402 can be determined. The maximum count can be also determined though a mathematical curve fit algorithm. The same method can be applied if signals 401 and 402 are square wave signals. The maximum value can be determined as the middle of a maximum count values section of the sequence or though a mathematical curve fit algorithm. The phase shift calculation can be performed in the phase calculator block 305 in FIG. 3, or alternately it may be performed on an external device or computer connected to the programmable logic device.

Figure 5:
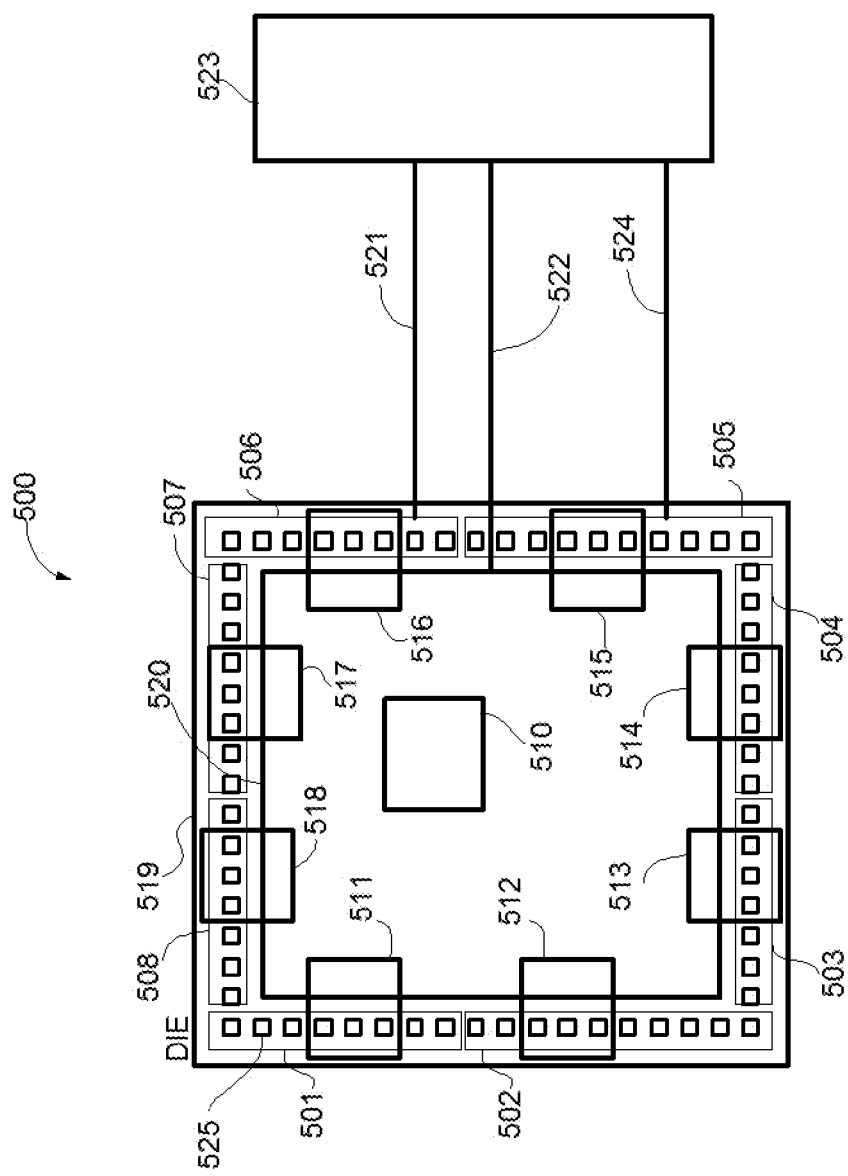
FIG. 5 illustrates a structural diagram of an embodiment of the current invention that implements additional measurement systems on other I/O banks of the same programmable logic device.

This invention was described so far as implemented on the core logic and on one I/O bank of a programmable logic device. In another embodiment, shown in FIG. 5, the invention implements additional measurement systems on other I/O banks of the same programmable logic device. In the example generally designated 500 in FIG. 5. A programmable logic device die 519 is connected to a power distribution system 523 through electrical interconnects 522 for logic core and 521, 524 for I/O banks. For simplicity only two interconnects for I/O banks are shown, but each I/O bank may have its own interconnect. The programmable logic device 519 has 8 I/O banks 501-508, and a core logic 520. System 510 measures the magnitude and phase of the core logic power supply domain and contains the elements of first system 206 and third system 208 of FIG. 2. System 511 measures the magnitude and phase of the power supply domain of I/O bank 1 501. System 511 contains the elements of second system 207 and fourth system 209 of FIG. 2. In addition to these systems, in this embodiment of the invention, system 512 is structurally identical to system 511 and measures the magnitude and phase of the power supply domain of I/O bank 2 502. System 513 is structurally identical to system 511 and measures the magnitude and phase of the power supply domain of I/O bank 3 503. Similarly, systems 514-518 are structurally identical to system 511 and measure the magnitude and phase of the power supply domains of I/O banks 4-8, 504-508.

Each system 510-518 takes turn to generate sinusoidal or square wave current signal through the corresponding power supply domain of the power distribution network and the rest of systems measure the magnitude and phase of the voltage signals on their own power supply domain. From these measurements a multi-port z-parameter model or s-parameter model is generated. Other types of models can be derived from the s-parameter or z-parameter models.

Another embodiment of this invention, shown in FIGS. 6A, 6B, and 6C, applies to multi-die programmable logic devices, like for example multi-die FPGAs, and 3D-IC FPGAs. These are programmable logic devices containing multiple dies mounted in the same package through different manufacturing technologies. 3D-IC may stack multiple dies one on top of another with an interposer in between for electrical connections. In other manufacturing technologies multiple FPGA dies may be mounted on the same package. FIG. 6A represents a programmable logic device having two dies mounted in the same package, generally designated 600. For simplicity only two dies have been represented, but the invention applies the same for any number of dies mounted in the same package. Also, the invention applies the same for dies mounted on the same package or stacked on top of each other like in 3D-IC devices.

With reference to functional block diagram 600 shown in FIG. 6A, a first die, DIE1, 601 and a second die, DIE2, 602 are mounted on an interposer 603 inside package 604. The power distribution for the two dies has not been explicitly represented in this figure for simplicity. The power distribution network of die 601 contains structural elements of the interposer 603 and package 604. The power distribution network of die 602 contains structural elements of the interposer 603 and package 604. Due to electromagnetic interference and shared electrical interconnects on interposer and package, there will be coupling between the power distribution network of first die 601 and second die 602.

Die 601 has a similar structure as the programmable logic die 201 in FIG. 2, and die 602 also has a similar structure as the programmable logic die 201 in FIG. 2. Each die, 601 and 602, contains a logic core and multiple I/O banks. Die 601 contains a logic core 613 and multiple I/O banks 614. Die 602 contains a logic core 611 and multiple I/O banks 612.

In this embodiment of the invention, system 605 measures the magnitude and phase of the power supply domain of die 601 logic core 613, system 606 measures the magnitude and phase of the power supply domain of die 602 logic core, systems 607 and 608 measure the magnitude and phase of two I/O banks power supply domains of die 601, and systems 609 and 610 measure the magnitude and phase of two I/O banks power supply domains of die 602. For simplicity this embodiment of the invention shows measurement systems on only two I/O banks of each die, but any number of I/O banks can be measured on each die.

Each system 605-610 takes turn to generate sinusoidal or square wave signal trough the corresponding power supply domain of the power distribution network and the rest of systems measure the magnitude and phase of the signals on their own power supply domain. From these measurements a multi-port z-parameter model or s-parameter model of the entire power distribution network of DIE1 and DIE2 is generated. Other types of models can be derived from the s-parameter or z-parameter models.

FIG. 6B shows a simplified cross-section view generally designated 624 of an embodiment of the invention implemented on a multi-die programmable logic device having two dies, first die 615 and second die 616, mounted on an interposer 617 and the interposer mounted on a package 618. Alternately the interposer may be omitted and the dies may be mounted directly on the package. For simplicity only two dies are shown but the invention applies to any number of dies. Each die contains the systems described in the structural diagram of FIG. 6A, and performs the phase and magnitude measurements and generates the s-parameter, z-parameter or any other model type described in the previous sections.

FIG. 6C shows a simplified cross-section view generally designated 625 of an embodiment of the invention implemented in a 3D-IC multi-die programmable logic device having two dies, first die 619 mounted on interposer 623, interposer 623 mounted on second die 620, second die 620 mounted on interposer 621 and interposer 621 mounted on package 622. Depending on specific manufacturing technology one or more interposers may be omitted and dies may be stacked directly one on top of each other and connected directly to the package. Each die contains the systems described in the structural diagram of FIG. 6A, and performs the phase and magnitude measurements and generates the s-parameter, z-parameter or any other model type described in the previous sections.

What is claimed is:

1. A method for measuring the phase of periodic variations of the voltage of a power supply domain of a programmable logic device containing configurable blocks powered from the power supply domain, comprising:
   configuring the programmable logic device to implement a current load generator that consumes a periodic varying electric current from a power supply domain the said periodic varying electric current having an activate feature and a frequency programming feature;
   configuring the programmable logic device to implement a ring oscillator containing configurable blocks powered from said power supply domain;
   configuring the programmable logic device to implement a phase and phase modulation measurement function for said ring oscillator;
   programming a frequency value of said periodic varying electric current, activating said periodic varying electric current, measuring the phase and phase modulation of said ring oscillator, calculating the phase of the voltage variation of the power supply domain by computations including the measured phase and phase modulation of said ring oscillator.

2. The method of claim 1 wherein the current load generator divides the period of the varying electric current into a plurality of time intervals and generates phase signals for each time interval, the phase and phase modulation measurement function uses said phase signals to count the number of said ring oscillator oscillation periods within each time interval, the phase of the voltage variation of said power supply domain is determined from the distribution of the counted numbers within the time intervals corresponding to a period of the varying electric current.

3. The method of claim 1 further comprising the step of:
   calculating the Z11 parameter of the power supply domain by computations that include the phase of the voltage variation of the power supply domain.

4. The method of claim 3 further comprising the step of:
repeating the steps of claim 1 for multiple said programmed frequency values of the periodic varying electric current to provide a plurality of Z11 parameters corresponding to each programmed frequency value.

5. The method of claim 4 further comprising the step of:
converting the Z11 parameters into S11 parameters and creating an s-parameter model of the power distribution network of said power supply domain.

6. A method for measuring the phase of a periodic variation of the voltage of one or more power supply domains of a programmable logic device containing configurable blocks powered from the power supply domains, comprising:
   configuring the programmable logic device to implement a first current load generator that consumes a first periodic varying electric current from a first power supply domain the said first periodic varying electric current having an activate feature and a frequency programming feature;
   configuring the programmable logic device to implement a second current load generator that consumes a second periodic varying electric current from a second power supply domain the said second periodic varying electric current having an activate feature and a frequency programming feature;
   configuring the programmable logic device to implement a first ring oscillator containing configurable blocks powered from the first power supply domain;
   configuring the programmable logic device to implement a second ring oscillator containing configurable blocks powered from the second power supply domain;
   configuring the programmable logic device to implement phase and phase modulation measurement functions for the ring oscillators;
   programming a frequency value of said first periodic varying electric current, activating said first periodic varying electric current, measuring the phase and phase modulation of the first ring oscillator, deactivating said first periodic varying electric current, calculating the phase of the voltage variation of the first power supply domain by computations including the measured phase and phase modulation of the first ring oscillator;
   calculating the Z11 parameter of the first power supply domain by computations that include the phase of the voltage variation of the first power supply domain;
   programming a frequency value of said first periodic varying electric current, activating said first periodic varying electric current, measuring the phase and phase modulation of the second ring oscillator, deactivating said first periodic varying electric current, calculating the phase of the voltage variation of the second power supply domain by computations including the measured phase and phase modulation of said second ring oscillator;
   calculating the Z21 parameter of the second power supply domain by computations that include the phase of the voltage variation of the second power supply domain;

programming a frequency value of said second periodic varying electric current, activating said second periodic varying electric current, measuring the phase and phase modulation of the first ring oscillator, deactivating said second periodic varying electric current, calculating the phase of the voltage variation of the first power supply domain by computations including the measured phase and phase modulation of the first ring oscillator;

calculating the Z12 parameter of the first power supply domain by computations that include the phase of the voltage variation of the first power supply domain;

programming a frequency value of said second periodic varying electric current, activating said second periodic varying electric current, measuring the phase and phase modulation of the second ring oscillator, deactivating said second periodic varying electric current, calculating the phase of the voltage variation of the second power supply domain by computations including the measured phase and phase modulation of the second ring oscillator;

calculating the Z22 parameter of the second power supply domain by computations that include the phase of the voltage variation of the second power supply domain.

7. The method of claim 6 further comprising the step of: repeating the steps of claim 6 for multiple said programmed frequency values of the periodic varying electric current to provide a plurality of Z parameters corresponding to each programmed frequency value.

8. The method of claim 7 further comprising the step of: expanding the steps of claims 6-7 to a plurality of N power supply domains for each power supply domain calculating the network parameters Zpq where $1=<p=<N$ and $1=<q=<N$.

9. The method of claim 7 further comprising the step of: converting the Z parameters into S parameters and creating an S-parameter model of the programmable logic device power distribution network.

10. The method of claim 6 wherein the current load generator divides the period of the varying current into a plurality of time intervals and generates phase signals for each time interval, the phase and phase modulation measurement function uses said phase signals to count the number of ring oscillator oscillation periods within each time interval, and the phase of the voltage variation of said power supply domain is determined from the distribution of the counted numbers within the time intervals corresponding to a period of the varying electric current.

* * * * *